United States Patent
Mihara

(10) Patent No.: US 10,388,822 B2
(45) Date of Patent: Aug. 20, 2019

(54) ENCASED ADHESIVE TAPE AND METHOD FOR MANUFACTURING SOLAR CELL MODULE

(71) Applicant: Panasonic Intellectual Property Management Co., Ltd., Osaka (JP)

(72) Inventor: Junya Mihara, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/059,500

(22) Filed: Aug. 9, 2018

(65) Prior Publication Data

US 2019/0013432 A1 Jan. 10, 2019

Related U.S. Application Data

(63) Continuation of application No. PCT/JP2017/001901, filed on Jan. 20, 2017.

(30) Foreign Application Priority Data

Feb. 16, 2016 (JP) .................................. 2016-027412

(51) Int. Cl.
*C09J 7/20* (2018.01)
*H01L 31/20* (2006.01)
(Continued)

(52) U.S. Cl.
CPC .............. *H01L 31/206* (2013.01); *C09J 7/20* (2018.01); *C09J 7/30* (2018.01); *C09J 201/00* (2013.01);
(Continued)

(58) Field of Classification Search
CPC ................................................ C09J 2203/322
See application file for complete search history.

(56) References Cited

U.S. PATENT DOCUMENTS 5,370,916 A * 12/1994 Olsen ................. B65H 35/0026
428/40.1
6,541,089 B1 * 4/2003 Hamerski ................. C09J 7/10
428/40.1
2017/0288077 A1 * 10/2017 Kannou ................ H01L 31/042

FOREIGN PATENT DOCUMENTS

JP 2015-086325 A 5/2015
JP 2015086325 A * 5/2015 .............. C09J 7/403
(Continued)

OTHER PUBLICATIONS

International Search Report issued in Application No. PCT/JP2017/001901 dated Apr. 25, 2017, with English translation.

*Primary Examiner* — Michelle Mandala
*Assistant Examiner* — Jordan M Klein
(74) *Attorney, Agent, or Firm* — McDermott Will & Emery LLP

(57) ABSTRACT

An encased adhesive tape includes: an adhesive tape composite that includes adhesive tapes and connecting components, the adhesive tapes each including a base film and being arranged adjacent to one another in a longitudinal direction of the base film, the connecting components being band-shaped and each being arranged between the adhesive tapes; and a housing that is connected to one end of the adhesive tape composite in the longitudinal direction, and houses the adhesive tape composite. Each of the adhesive tapes includes a non-adhesive region in which an adhesive layer is not disposed, in an end portion out of end portions of the base film in the longitudinal direction, the end portion being on the same side as the one end of the adhesive tape composite.

10 Claims, 8 Drawing Sheets

(51) Int. Cl.
*C09J 201/00* (2006.01)
*H01L 31/05* (2014.01)
*C09J 7/30* (2018.01)
*H01L 21/66* (2006.01)
*H01L 31/02* (2006.01)
*H01L 31/0224* (2006.01)
*H01L 31/048* (2014.01)
*H01L 31/0747* (2012.01)

(52) U.S. Cl.
CPC .......... *H01L 22/12* (2013.01); *H01L 31/0201* (2013.01); *H01L 31/022425* (2013.01); *H01L 31/048* (2013.01); *H01L 31/05* (2013.01); *H01L 31/0504* (2013.01); *H01L 31/0512* (2013.01); *H01L 31/0747* (2013.01); *C09J 2201/28* (2013.01); *C09J 2203/322* (2013.01); *C09J 2400/226* (2013.01); *Y02E 10/50* (2013.01)

(56) References Cited

FOREIGN PATENT DOCUMENTS

| | | |
|---|---|---|
| JP | 2015-101590 A | 6/2015 |
| JP | 2015-113382 A | 6/2015 |

\* cited by examiner

ENCASED ADHESIVE TAPE AND METHOD FOR MANUFACTURING SOLAR CELL MODULE

CROSS REFERENCE TO RELATED APPLICATIONS

This application is a U.S. continuation application of PCT International Patent Application Number PCT/JP2017/001901 filed on Jan. 20, 2017, claiming the benefit of priority of Japanese Patent Application Number 2016-027412 filed on Feb. 16, 2016, the entire contents of which are hereby incorporated by reference.

BACKGROUND

1. Technical Field

The present disclosure relates to encased adhesive tapes and methods for manufacturing a solar cell module, and in particular to an encased adhesive tape used for manufacturing a solar cell module, and a method for manufacturing a solar cell module.

2. Description of the Related Art

Conventionally, solar cell modules have been developed as photoelectric conversion devices that convert light energy into electric energy. Solar cell modules can directly convert inexhaustible sunlight into electricity, and thus generate power with less environmental impact and more cleanly than power generation using fossil fuels. As a result, the solar cell modules are expected to provide new energy resources.

For example, a solar cell module has a structure in which solar cells are sealed with an encapsulant, between a front surface protective component and a back surface protective component. In the solar cell module, the solar cells are arranged in a matrix. Pairs of adjacent solar cells among solar cells linearly aligned in either the row direction or the column direction are connected by wiring members to form a string.

In order to manufacture the solar cell module of this kind, Patent Literature (PTL) 1 (Japanese Unexamined Patent Application Publication No. 2015-86325) discloses an adhesive tape composite for bonding a wiring member to a solar cell. This adhesive tape composite is formed by horizontally connecting band-shaped adhesive tapes via connecting components (connecting tapes). The adhesive tapes each have a structure in which an adhesive layer and a release cover film are disposed in listed order above a base film. The connecting components each have a structure in which a sticky layer and a release film are disposed in listed order above a base material.

Moreover, PTL 1 discloses bonding a wiring member to a solar cell by removing a release cover film and a release film from the adhesive tape composite and placing the exposed adhesive layer on the solar cell, transferring and fixing the adhesive layer onto the solar cell, and placing the wiring member on the transferred adhesive layer.

SUMMARY

With the adhesive tape composite disclosed in PTL 1, however, in the transferring of the adhesive layer onto the solar cell, when an end portion of the adhesive tape is placed on the solar cell and the adhesive layer is transferred and fixed onto the solar cell, a connecting component adjacent to the adhesive tape may come into contact with the solar cell or the sticky layer of the connecting component may adhere to the solar cell. Contact of a foreign object other than the adhesive tape with the solar cell may lead to a deterioration in quality of the solar cell.

In view of this, the present disclosure has been conceived to solve the above problem, and provides an encased adhesive tape and a method for manufacturing a solar cell module that can inhibit a foreign object from touching a solar cell.

In order to solve the above problem, an encased adhesive tape according to the present disclosure includes: an adhesive tape composite that includes a plurality of adhesive tapes and a plurality of connecting components, the plurality of adhesive tapes each including a base film and being arranged adjacent to one another in a longitudinal direction of the base film, the plurality of connecting components being band-shaped and each being arranged between the plurality of adhesive tapes, the base film being a film that is band-shaped and on which an adhesive layer is disposed; and a housing that is connected to one end of the adhesive tape composite in the longitudinal direction, and houses the adhesive tape composite. Each of the plurality of adhesive tapes includes a non-adhesive region in which the adhesive layer is not disposed, in an end portion out of end portions of the base film in the longitudinal direction, the end portion being on the same side as the one end of the adhesive tape composite.

Moreover, in order to solve the above problem, a method for manufacturing a solar cell module according to the present disclosure includes: preparing two solar cells that are adjacent to one another in a direction parallel to a light-receiving surface; forming a plurality of finger electrodes on each of the two solar cells, the plurality of finger electrodes collecting electric charges generated from light received by a solar cell; forming a bus bar electrode that extends in a direction crossing the plurality of finger electrodes, the bus bar electrode electrically connecting the plurality of finger electrodes; placing, along the bus bar electrode, the adhesive tape composite of an encased adhesive tape, and transferring the adhesive layer of the adhesive tape composite onto the bus bar electrode; and disposing a wiring member on the adhesive layer transferred onto the bus bar electrode, the wiring member electrically connecting the two solar cells.

An encased adhesive tape according to the present disclosure can inhibit a foreign object from touching a solar cell.

A method for manufacturing a solar cell module according to the present disclosure can inhibit contact of a foreign object when an adhesive layer is transferred onto a solar cell.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT

Hereinafter, an encased adhesive tape and a solar cell module according to an embodiment of the present disclosure will be described in detail with reference to the drawings. The embodiment described below shows a specific example of the present disclosure. The numerical values, shapes, materials, structural components, the arrangement and connection of the structural components, etc. shown in the following embodiment are mere examples, and are not intended to limit the scope of the present disclosure. Furthermore, among the structural components in the following embodiment, structural components not recited in any one of the independent claims which indicate the broadest concepts of the present disclosure are described as optional structural components.

The figures are schematic diagrams and are not necessarily precise illustrations. Furthermore, in the figures, identical structural components are assigned identical reference signs.

Embodiment

Prior to describing an encased adhesive tape according to an embodiment, a basic configuration of a solar cell module, a structure of a solar cell, and a structure of the solar cell module will be described.

[1. Basic Configuration of Solar Cell Module]

Figure 1:
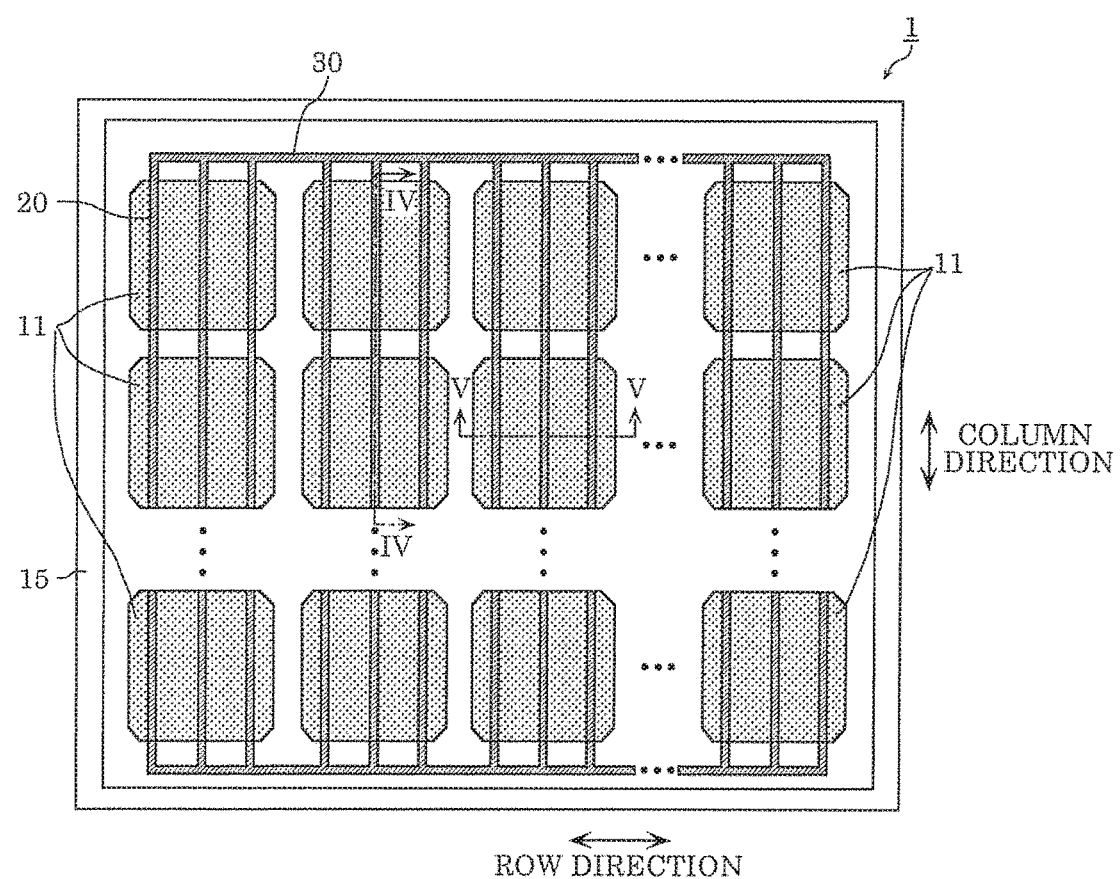
FIG. 1 is a schematic plan view of a solar cell module relevant to an embodiment.

The following describes an example of the basic configuration of the solar cell module with reference to FIG. 1.

FIG. 1 is a schematic plan view of solar cell module 1. As shown in FIG. 1, solar cell module 1 includes solar cells 11, wiring members 20, connecting lines 30, and frame 15.

Solar cells 11 are plate-shaped photovoltaic cells that are two-dimensionally arranged on a light-receiving surface of solar cell module 1 and generate power by being exposed to light. Wiring members 20 are wiring components that are disposed on surfaces of solar cells 11 and electrically connect solar cells 11 adjacent to each other in the column direction. Connecting lines 30 are wiring components that connect solar cell strings. It should be noted that the solar cell strings each are an aggregate of solar cells arranged in the column direction and connected by wiring members 20.

Frame 15 is an outer frame component that covers a perimeter portion of a panel on which solar cells 11 are two-dimensionally arranged.

[2. Structure of Solar Cell]

The following describes solar cell 11 that is a main component of solar cell module 1.

Figure 2:
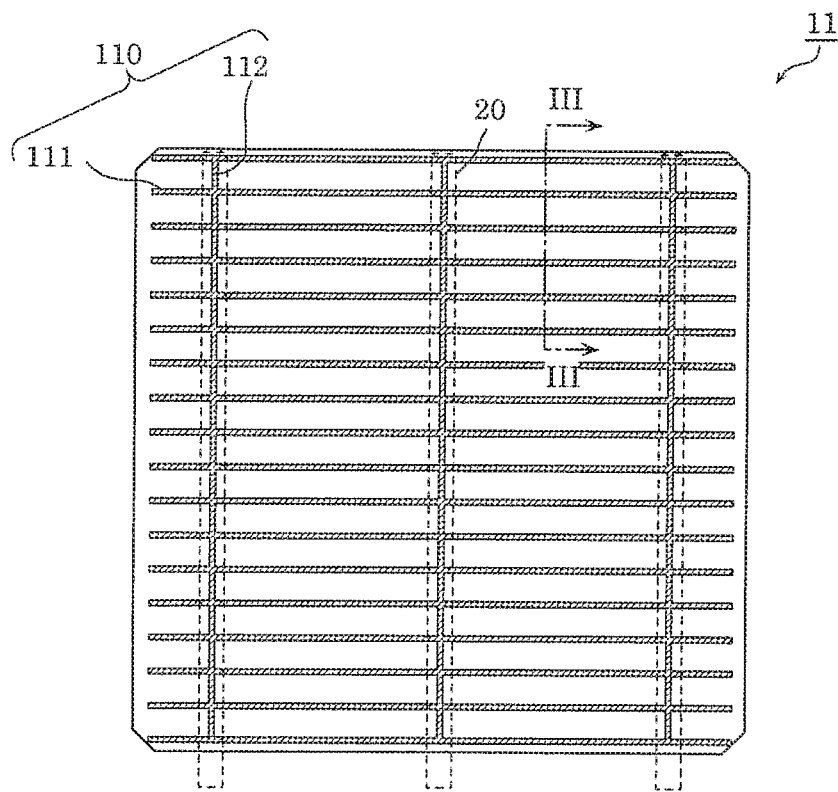
FIG. 2 is a plan view of a solar cell relevant to the embodiment.

FIG. 2 is a plan view of solar cell 11. As shown in FIG. 2, solar cell 11 is substantially square-shaped in a plan view. Solar cell 11 has, for example, a length of 125 mm, a width of 125 mm, and a thickness of 200 μm. On a surface of solar cell 11, bus bar electrodes 112 that are stripe-shaped are arranged in parallel to each other, and finger electrodes 111 that are stripe-shaped are arranged in parallel to each other to cross bus bar electrodes 112 at right angles. Bus bar electrodes 112 and finger electrodes 111 constitute collector electrode 110.

Bus bar electrodes 112 have, for example, a line width of 150 μm. Finger electrodes 111 have, for example, a line width of 100 μm, and a distance between finger electrodes 111 is, for example, 2 mm. Wiring members 20 are bonded onto bus bar electrodes 112.

Figure 3:
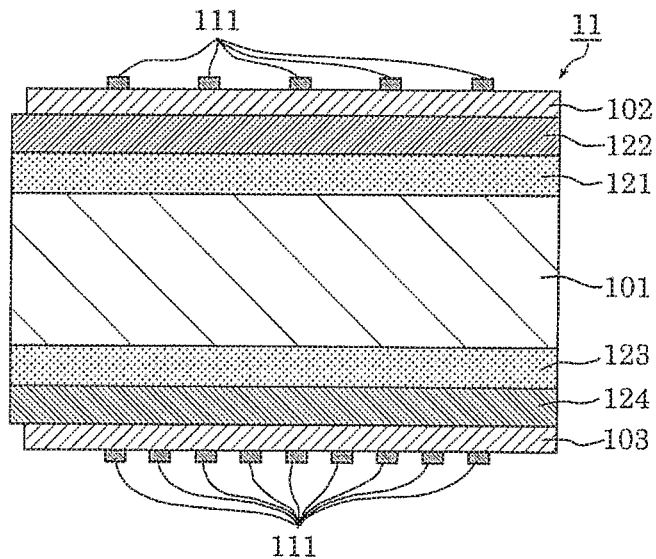
FIG. 3 is a cross-sectional view of a layered structure of the solar cell relevant to the embodiment.

FIG. 3 is a cross-sectional view of a layered structure of solar cell 11. It should be noted that FIG. 3 is a cross-sectional view of solar cell 11 taken along line III-III shown in FIG. 2. As shown in FIG. 3, i-type amorphous silicon film 121 and p-type amorphous silicon film 122 are disposed in listed order above a principal surface of n-type monocrystalline silicon wafer 101. N-type monocrystalline silicon wafer 101, i-type amorphous silicon film 121, and p-type amorphous silicon film 122 constitute a photoelectric conversion layer, and n-type monocrystalline silicon wafer 101 serves as a principal power generation layer. Furthermore, light-receiving surface electrode 102 is disposed on p-type amorphous silicon film 122. As shown in FIG. 2, collector electrode 110 constituted by bus bar electrodes 112 and finger electrodes 111 is disposed on light-receiving surface electrode 102. It should be noted that FIG. 3 shows only finger electrodes 111 of collector electrode 110.

Moreover, i-type amorphous silicon film 123 and n-type amorphous silicon film 124 are disposed in listed order below a back surface of n-type monocrystalline silicon wafer 101. Further, light-receiving surface electrode 103 is disposed on n-type amorphous silicon film 124, and collector electrode 110 constituted by bus bar electrodes 112 and finger electrodes 111 is disposed on light-receiving surface electrode 103.

Light-receiving surface electrodes 102 and 103 are, for example, transparent electrodes made of ITO (indium tin oxide), $SnO_2$ (tin oxide), ZnO (zinc oxide), etc. Solar cell 11 may be of a unifacial light-receiving type or a bifacial light-receiving type.

[3. Structure of Solar Cell Module]

Next, the following describes a specific structure of solar cell module 1.

Figure 4:
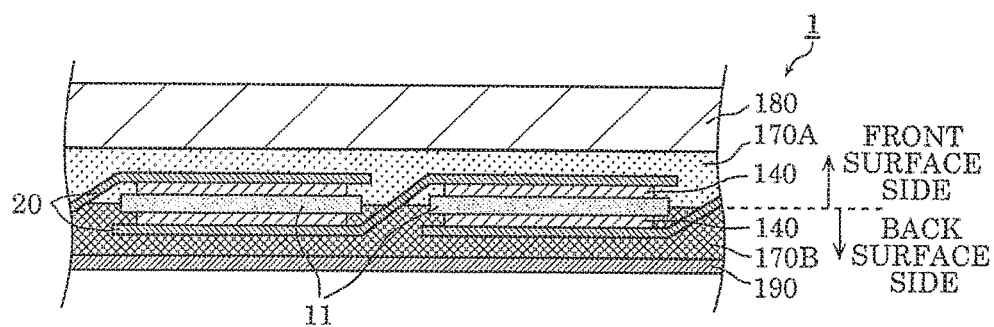
FIG. 4 is a structural cross-sectional view of the solar cell module relevant to the embodiment, in a column direction.

FIG. 4 is a structural cross-sectional view of solar cell module 1, in the column direction. Specifically, FIG. 4 is a cross-sectional view of solar cell module 1 taken along line IV-IV shown in FIG. 1. Solar cell module 1 shown in FIG. 1 includes solar cells 11 each having the front surface and back surface on which collector electrodes 110 are disposed, wiring members 20, adhesive components 140, front surface encapsulant 170A, back surface encapsulant 170B, front surface protective component 180, and back surface protective component 190.

Wiring members 20 are conductive elongated lines, and ribbon-shaped metal foil, for example. The under surface of wiring member 20 at an end portion is connected to bus bar electrode 112 (see FIG. 2) on the front surface side of one of solar cells 11 along the long side of bus bar electrode 112. The top surface of wiring member 20 at the other end is connected to bus bar electrode 112 on the back surface side of the other of solar cells 11 along the long side of bus bar electrode 112. Accordingly, a solar cell string including solar cells 11 aligned in the column direction has a configuration in which solar cells 11 are connected in series in the column direction.

Wiring members 20 and bus bar electrodes 112 (see FIG. 2) are bonded by adhesive components 140. In other words, adhesive components 140 bond bus bar electrodes 112 and wiring members 20 so that bus bar electrodes 112 and wiring members 20 overlap when the light-receiving surface is seen in a plan view. In consequence, wiring members 20 are connected to solar cells 11 via adhesive components 140. It should be noted that a bonded structure of bus bar electrodes 112 and wiring members 20 is formed by transferring adhesive layers to be described below onto bus bar electrodes 112, placing wiring members 20 on the adhesive layers, and curing the adhesive layers.

With this configuration, finger electrodes 111 collect electric charges generated from received light in solar cells 11, and bus bar electrodes 112 extend in the direction crossing finger electrodes 111 and transmit the electric charges to wiring members 20.

[4. Structure of Encased Adhesive Tape]

Next, the following describes an encased adhesive tape according to the embodiment. The encased adhesive tape is an encased adhesive tape used for manufacturing a solar cell module, and includes adhesive layers for use in bonding wiring members 20 to bus bar electrodes 112.

Figure 5:
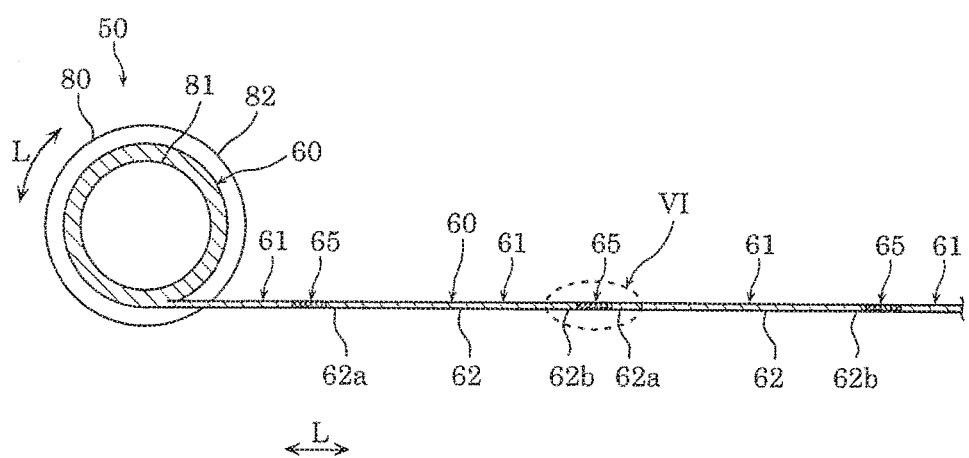
FIG. 5 is a cross-sectional view illustrating an outline of an encased adhesive tape according to the embodiment.
Figure 6:
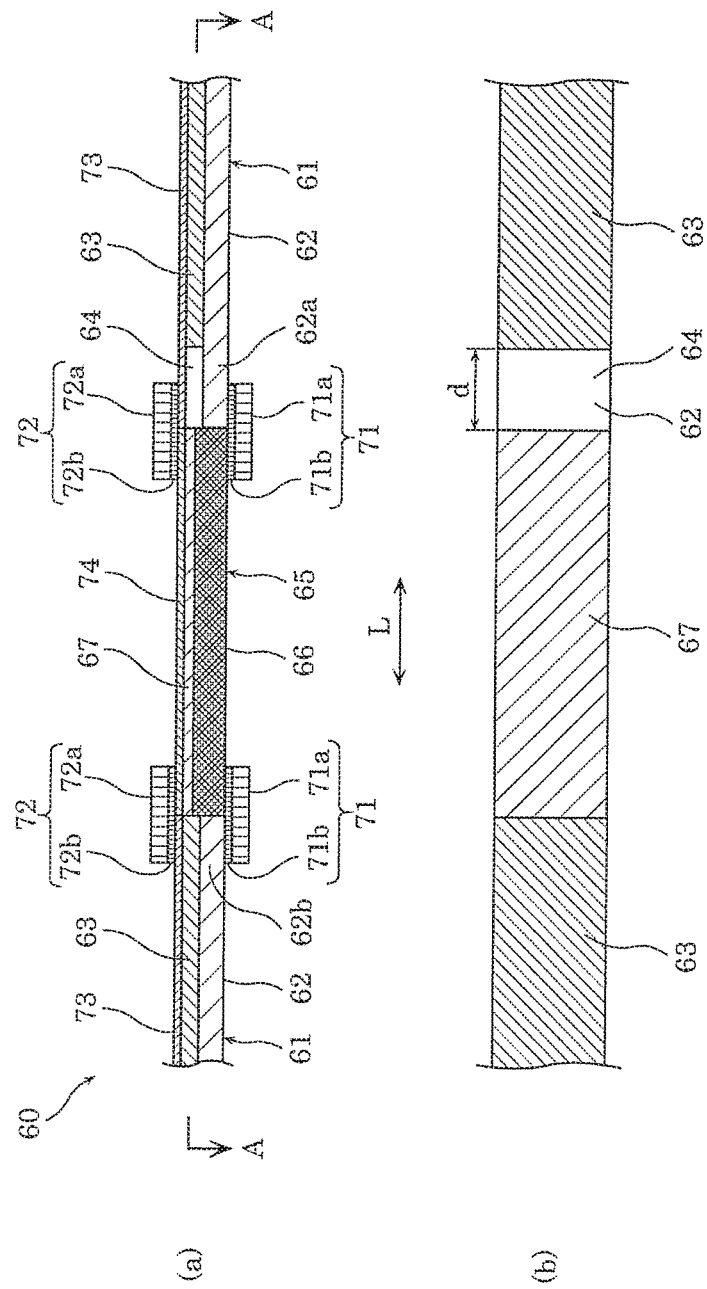
FIG. 6 is a diagram in which (a) shows a cross-sectional view of an adhesive tape composite included in the encased adhesive tape according to the embodiment (a detail view of "VI" part indicated in FIG. 5), and (b) shows a cross-sectional view taken along line A-A.

FIG. 5 is a cross-sectional view illustrating an outline of encased adhesive tape 50. FIG. 6 is a diagram in which (a) shows a cross-sectional view of adhesive tape composite 60 included in encased adhesive tape 50 (a detail view of "VI" part indicated in FIG. 5), and (b) shows a cross-sectional view taken along line A-A.

As shown in FIG. 5, encased adhesive tape 50 includes band-shaped adhesive tape composite 60, and housing 80 that houses adhesive tape composite 60.

Housing 80 is, for example, a reel, and includes core 81 and a pair of lateral plates 82 disposed at both ends of core 81. Core 81 is connected to one end of adhesive tape composite 60 in longitudinal direction L. Adhesive tape composite 60 is wound in a circumferential direction of core 81. Adhesive tape composite 60 is wound such that adhesive layers 63 to be described below face inward, and base films 62 face outward. When adhesive tape composite 60 is used, as shown in FIG. 5, the other end of adhesive tape composite 60 in longitudinal direction L is pulled out from housing 80.

As shown in (a) of FIG. 6, adhesive tape composite 60 includes adhesive tapes 61 adjacent to each other, and connecting components 65 each disposed between adjacent adhesive tapes 61. In addition, adhesive tape composite 60 includes first cover films 73 corresponding to adhesive tapes 61, second cover films 74 corresponding to connecting components 65, base-side connecting tapes 71, and cover-side connecting tapes 72.

Adhesive tapes 61 each include band-shaped base film 62 and adhesive layer 63 disposed on base film 62. Adhesive tapes 61 are disposed adjacently to each other at intervals in longitudinal direction L of base film 62.

Base films 62 are flexible and are made of a material such as a PET film. Base films 62 have, for example, a length of approximately 500 m, a width of approximately 1 mm, and a thickness of at least 10 μm and at most 100 μm.

Adhesive layers 63 are disposed on one of the surfaces of base films 62. Adhesive layers 63 are an adhesive for electrically connecting bus bar electrodes 112 and wiring members 20 of solar cells 11.

Examples of a material of adhesive layers 63 include a conductive adhesive. The conductive adhesive is, for example, an adhesive obtained by dispersing conductive particles in a thermosetting adhesive resin material such as an epoxy resin, an acrylic resin, or a urethane resin. Adhesive layers 63 have a thickness of, for example, at least 10 μm and at most 100 μm.

In the embodiment, adhesive tapes 61 each have a portion in which adhesive layer 63 is not disposed on the one of the surfaces of base film 62. In other words, adhesive tapes 61 each include non-adhesive region 64 in which adhesive layer 63 is not disposed. Non-adhesive region 64 is disposed at, out of end portions 62a and 62b of base film 62 in longitudinal direction L, end portion 62a located on the same side as one end of adhesive tape composite 60 (a side on which adhesive tape composite 60 is connected to housing 80).

Non-adhesive region 64 is a region disposed such that, for example, connecting component 65 does not easily touch solar cell 11 when adhesive layer 63 is transferred onto solar cell 11. It should be noted that non-adhesive region 64 is not present at end portion 62b of base film 62 in longitudinal direction L, and adhesive layer 63 is disposed at end portion 62b.

As shown in (b) of FIG. 6, a distance of non-adhesive region 64 in a width direction is the same as a width of base film 62. Distance d of non-adhesive region 64 in longitudinal direction L is predetermined distance d from an edge of end portion 62a. Although predetermined distance d is determined on the basis of, for example, a resolution of a camera that captures transferred adhesive layer 63, it is desirable that a ratio of predetermined distance d to a length of one side of solar cell 11 be at least 0.1. In addition, it is further desirable that the ratio of predetermined distance d be at most 0.3. In the embodiment, since the length of one side of solar cell 11 is 125 mm, it is desirable that predetermined distance d be at least 12.5 mm. In addition, it is further desirable that predetermined distance d be at most 37.5 mm.

First cover films 73 are disposed on adhesive layers 63 and non-adhesive regions 64. First cover films 73 are flexible and are made of a material such as a PET film. A release treatment is performed on, out of the front and back surfaces of first cover films 73, surfaces in contact with adhesive layers 63. First cover films 73 are taken off before adhesive layers 63 are transferred onto solar cells 11.

Connecting components 65 each are a component that connects adjacent base films 62, and are disposed between adjacent adhesive tapes 61. Connecting components 65 each include band-shaped base material 66, and sticky layer 67 disposed on base material 66.

Base material 66 is flexible and is made of a material such as a PET resin in which black fillers are dispersed. Base material 66 has a length of, for example, 0.3 m, and has the same width and thickness as base films 62. Sticky layer 67 is disposed on, out of the front and back surfaces of base material 66, a surface on the same side as a side on which adhesive layers 63 of adhesive tapes 61 are present.

It should be noted that when a position of above-described non-adhesive region 64 is seen with reference to connecting component 65, non-adhesive region 64 is disposed at, out of end portions 62a and 62b of base film 62 in longitudinal direction L, end portion 62a close to an edge of connecting component 65 on a side opposite the side on which the one end of adhesive tape composite 60 is present (the side on which adhesive tape composite 60 is connected to housing 80).

Second cover films 74 are each disposed on sticky layer 67 of connecting component 65. Second cover films 74 are flexible and are made of a material such as a PET film. The release treatment is performed on, out of the front and back surfaces of second cover film 74, a surface in contact with sticky layer 67. Second cover films 74 are taken off before adhesive layers 63 are transferred onto solar cells 11.

Base-side connecting tapes 71 each are a tape that connects adhesive tape 61 and connecting component 65 on a front surface of adhesive tape 61 on a side facing base film 62. Base-side connecting tapes 71 each include base material 71a and sticky layer 71b. For example, base material 71a includes a PET film, and sticky layer 71b includes an acrylic resin. Base-side connecting tapes 71 each connect adhesive tape 61 and connecting component 65 by being stuck to base film 62 and base material 66 of connecting component 65.

Cover-side connecting tapes 72 each are a tape that connects first cover film 73 and second cover film 74 on a front surface on a side facing first cover film 73. Cover-side connecting tapes 72 each include base material 72a and sticky layer 72b. For example, base material 72a includes a PET film, and sticky layer 72b includes an acrylic resin. Cover-side connecting tapes 72 each connect first cover film 73 and second cover film 74 by being stuck to first cover film 73 and second cover film 74.

In the embodiment, base-side connecting tapes 71 each connect an end portion of base film 62 and an end portion of base material 66 of connecting component 65, and cover-side connecting tapes 72 each connect an end portion of first cover film 73 and an end portion of second cover film 74. Accordingly, adhesive tape composite 60 is configured such that first cover films 73 and second cover films 74 are integrally removed.

When adhesive layers 63 are transferred onto solar cells 11, first cover films 73 and second cover films 74 are removed to expose adhesive layers 63. After first cover film 73 is taken off from an edge of first cover film 73, second cover film 74 is taken off via cover-side connecting tape 72. Exposed adhesive layer 63 is transferred onto bus bar electrode 112 of solar cell 11 by a thermocompression bonding head (not shown) pressing exposed adhesive layer 63 to solar cell 11 via base film 62.

It should be noted that above-described longitudinal direction L of base film 62 is the same as a direction in which adhesive tape composite 60 extends when adhesive tape composite 60 is pulled out from housing 80, and is a direction along the shape of adhesive tape composite 60 housed in housing 80 when adhesive tape composite 60 is housed. For example, when adhesive tape composite 60 is wound around the reel, the winding direction is longitudinal direction L of base film 62.

[5. Method for Manufacturing Solar Cell Module]

Next, the following describes a method for manufacturing solar cell module 1 according to the embodiment.

The method for manufacturing solar cell module 1 includes: preparing solar cells 11; forming finger electrodes 111; forming bus bar electrodes 112; transferring adhesive layers 63; and disposing wiring members 20. In addition, the method for manufacturing solar cell module 1 includes inspecting transferred adhesive layers 63.

First, two solar cells 11 that are adjacent horizontally to a light-receiving surface are prepared.

Next, finger electrodes 111 that collect electric charges generated from received light in solar cell 11 are formed on a front surface of one of two solar cells 11 and on a back surface of the other of two solar cells 11. Finger electrodes 111 are formed by a printing method such as screen printing, using a thermosetting resin conductive paste in which a resin material is used as a binder and conductive particles such as silver particles are used as a filler.

Next, but bar electrodes 112 that electrically connect finger electrodes 111 are formed. Bus bar electrodes 112 are formed to extend in a direction crossing finger electrodes 111 on the front surface of one of two solar cells 11 and on the back surface of the other of two solar cells 11. Bus bar electrodes 112 are formed by a printing method such as screen printing, using a thermosetting resin conductive paste in which a resin material is used as a binder and conductive particles such as silver particles are used as a filler.

Next, adhesive layer 63 of adhesive tape composite 60 is transferred onto bus bar electrode 112 formed on each of the front surface of one of two solar cells 11 and the back surface of the other of two solar cells 11.

Before adhesive layer 63 is transferred, adhesive tape composite 60 is pulled out from housing 80, and first cover film 73, cover-side connecting tape 72, and second cover film 74 are taken off in listed order from an edge of adhesive tape composite 60. As shown in (a) of FIG. 7, this exposes adhesive layer 63 and sticky layer 67 of adhesive tape composite 60.

Adhesive tape composite 60 of which adhesive layer 63 is exposed is rotated 180 degrees and placed above solar cell 11. Specifically, adhesive layer 63 is placed to face bus bar electrode 112. Subsequently, adhesive layer 63 is transferred onto bus bar electrode 112 by a thermocompression bonding head pressing adhesive tape composite 60 to solar cell 11 from behind base film 62.

Adhesive layers 63 each cover bus bar electrode 112 in whole. Specifically, adhesive layers 63 each cover a corresponding one of bus bar electrode 112 on the front surface of one of two solar cells 11 and bus bar electrode 112 on the back surface of the other of two solar cells 11. Moreover, adhesive layers 63 are each transferred onto a corresponding one of bus bar electrodes 112 such that adhesive layer 63 has a substantially same length as one side of solar cell 11. The length of adhesive layer 63 transferred onto solar cell 11 may be within a tolerance of, for example, at most 20 mm.

Next, adhesive layer 63 transferred onto solar cell 11 is inspected. Specifically, a location or length of end portion 63a of adhesive layer 63 in a direction in which bus bar electrode 112 extends is inspected. The location or length of end portion 63a of adhesive layer 63 can be captured using a camera etc. It should be noted that in the inspecting, the presence or absence of adhesive layer 63 at two locations may be detected using two cameras, and the location of end portion 63a of adhesive layer 63 may be detected. In addition, a missing part of adhesive layer 63 may be detected using a camera, and acceptability of a length of adhesive layer 63 may be checked.

Figure 7:
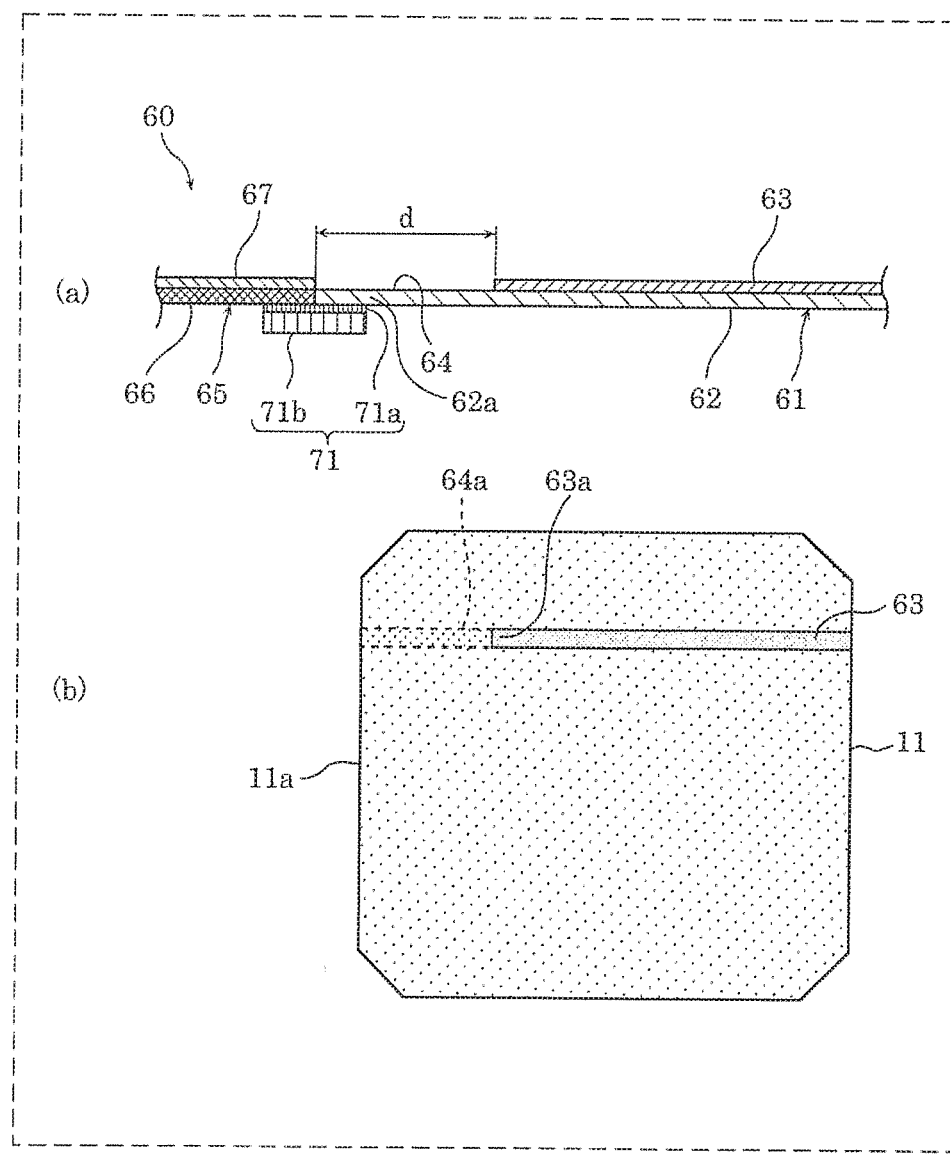
FIG. 7 is a diagram in which (a) shows a state in which a cover film of the adhesive tape composite shown in FIG. 6 is removed, and (b) shows a state in which an adhesive layer of the adhesive tape composite is transferred onto a solar cell.

(b) of FIG. 7 shows a state in which adhesive layer 63 of adhesive tape composite 60 is transferred onto solar cell 11.

When, in the transferring of adhesive layer 63, which is the previous step, an end portion (end portion 62a) of adhesive tape 61 is placed above solar cell 11, and the transferring is performed in the place, as shown in (b) of FIG. 7, untransferred region 64a in which adhesive layer 63 is not transferred is formed from left side 11a toward the inside of solar cell 11. It should be noted that left side 11a is, among four sides of solar cell 11 that is substantially square-shaped, a side of solar cell 11 in a direction opposite to the direction in which adhesive tape composite 60 is pulled out.

In the inspecting of adhesive layer 63, a location or length of an end portion of untransferred region 64a corresponding to the location or length of end portion 63a of adhesive layer 63 can also be detected. When untransferred region 64a is detected, a transfer failure can be recognized in which the transferring is performed at the end portion of adhesive tape 61 but adhesive layer 63 is not transferred onto solar cell 11.

Untransferred region 64a has a configuration in which a foreign object that should not touch solar cell 11, such as connecting component 65, does not easily touch solar cell 11. In the embodiment, because non-adhesive region 64 having predetermined distance d is included at the end portion of adhesive tape 61, even when the end portion of adhesive tape 61 is placed above solar cell 11, connecting component 65 is located outside of left side 11a of solar cell 11. For this reason, non-adhesive region 64 touches solar cell 11, and connecting component 65 does not easily touch solar cell 11. In addition, sticky layer 67 of connecting component 65 can also be inhibited from being attached to solar cell 11. As a result, it is possible to inhibit any foreign object other than adhesive tape 61 from touching solar cell 11, and to prevent a deterioration in quality of solar cell 11.

Moreover, in the embodiment, because non-adhesive region 64 having predetermined distance d is included at the end portion of adhesive tape 61, as shown in (b) of FIG. 7, adhesive layer 63 is approximately 20% less in length than one side of solar cell 11. This makes it easy to determine, when adhesive layer 63 is inspected, the acceptability of the length of adhesive layer 63 placed above solar cell 11.

To put it differently, in the inspecting of the embodiment, the following are inspected: whether adhesive layer 63 having at least a predetermined length is transferred onto solar cell 11; and whether an unnecessary foreign object touches solar cell 11. This inspecting makes it possible to select and remove solar cell 11 onto which adhesive layer 63 having at least the predetermined length is not transferred or solar cell 11 that is touched by the foreign object.

After the inspecting, wiring member 20 is disposed on adhesive layer 63 transferred onto bus bar electrode 112. Wiring member 20 electrically connects two solar cells 11. Wiring member 20 can be produced by cutting, for example, metallic foil having surfaces entirely covered with solder, silver, etc., such as copper foil or silver foil, into strips having a predetermined length. With the steps described above, solar cell module 1 can be manufactured.

Description of Comparative Example

Here, the following describes an encased adhesive tape and a method for manufacturing a solar cell module in a comparative example.

Figure 8:
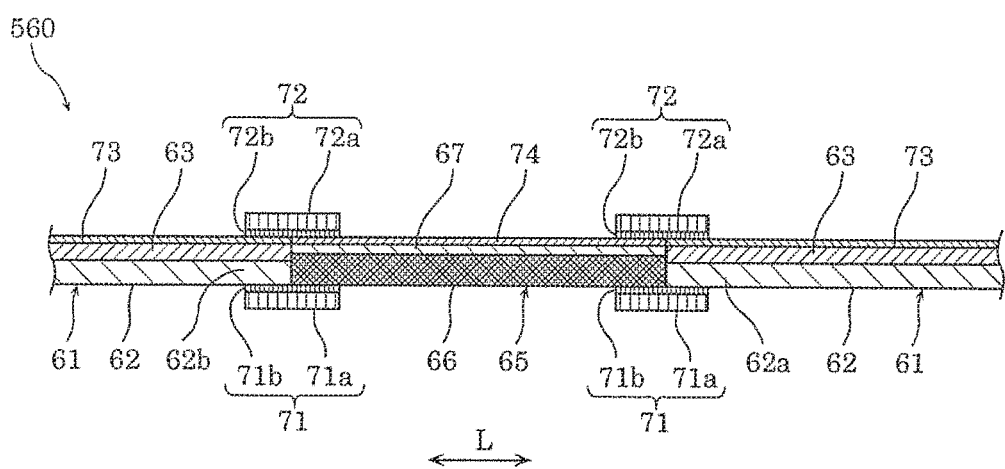
FIG. 8 is a cross-sectional view of an adhesive tape composite in a comparative example.

FIG. 8 is a cross-sectional view of adhesive tape composite 560 in the comparative example.

As shown in FIG. 8, in adhesive tape composite 560 in the comparative example, adhesive tape 61 does not include non-adhesive region 64, and adhesive layer 63 is disposed on one entire surface of base film 62.

The following describes a case in which adhesive layer 63 is transferred onto solar cell 11 using adhesive tape composite 560.

Before adhesive layer 63 is transferred, adhesive tape composite 560 is pulled out from housing 80, and first cover film 73, cover-side connecting tape 72, and second cover film 74 are taken off in listed order from an edge of adhesive tape composite 560. As shown in (a) of FIG. 9, this exposes adhesive layer 63 and sticky layer 67 of adhesive tape composite 560.

Adhesive tape composite 560 of which adhesive layer 63 is exposed is rotated 180 degrees, and pressed to solar cell 11 from behind base film 62 using a thermocompression bonding head. In consequence, adhesive layer 63 is transferred onto bus bar electrode 112.

Figure 9:
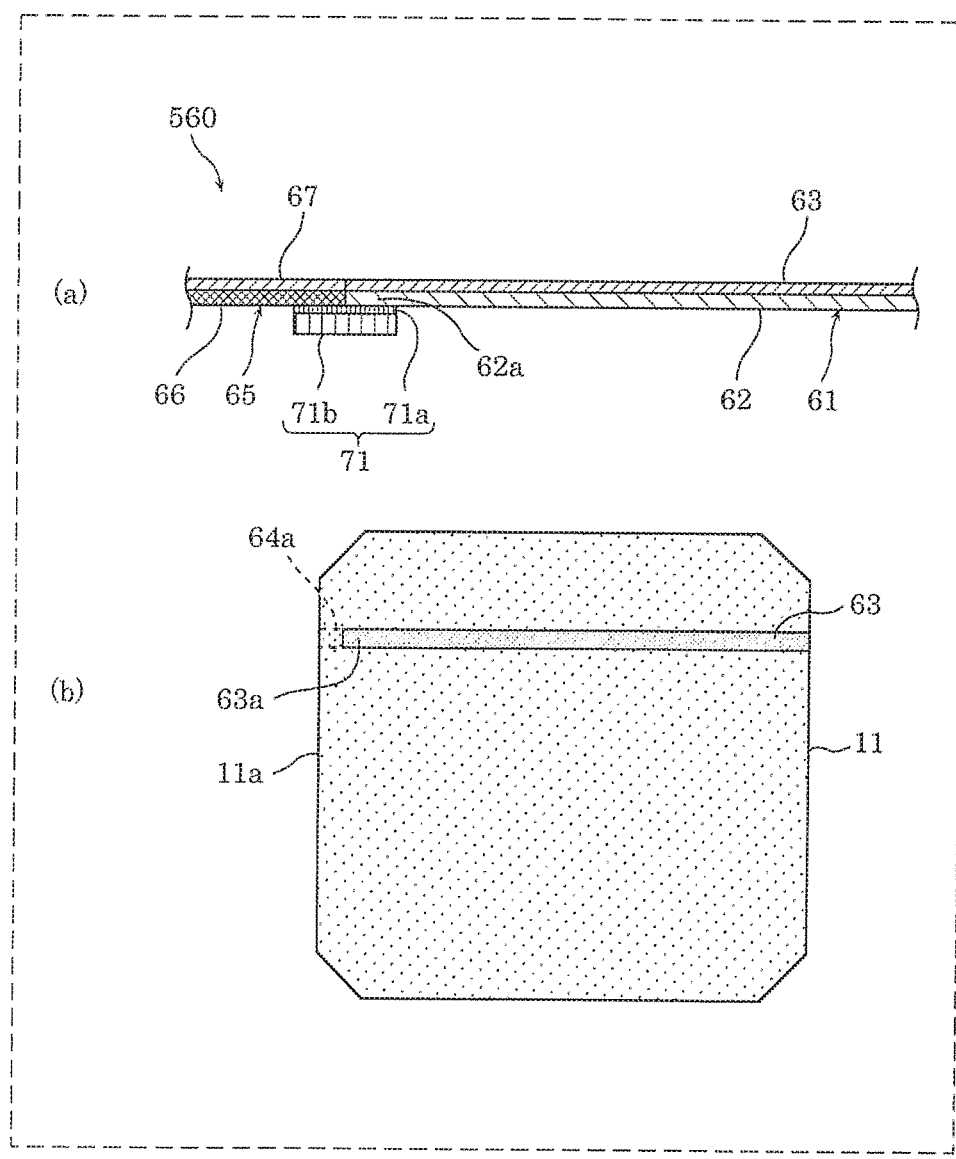
FIG. 9 is a diagram in which (a) shows a state in which a cover film of the adhesive tape composite in the comparative example is removed, and (b) shows a state in which an adhesive layer of the adhesive tape composite in the comparative example is transferred onto a solar cell.

(b) of FIG. 9 shows a state in which adhesive layer 63 of adhesive tape composite 560 is transferred onto solar cell 11.

Also in the comparative example, when, in the transferring of adhesive layer 63, an end portion of adhesive tape 61 is placed above solar cell 11, and the transferring is performed in the place, as shown in (b) of FIG. 9, untransferred region 64a is formed from left side 11a toward the inside of solar cell 11. In the comparative example, however, adhesive tape 61 and connecting component 65 are close to each other, and thus when the transferring by pressing is performed, connecting component 65 touches untransferred region 64a, and sticky layer 67 of connecting component 65 is attached to solar cell 11. As described above, in the comparative example, the quality of solar cell 11 may deteriorate because a foreign object such as connecting component 65 touches solar cell 11.

Moreover, in the comparative example, adhesive tape 61 and connecting component 65 are close to each other, and thus when the end portion of adhesive tape 61 is placed above solar cell 11, and the transferring is performed in the place, as shown in (b) of FIG. 9, a distance of untransferred region 64a (a length in longitudinal direction L) is shorter compared to the embodiment. For this reason, with inspecting of the comparative example, the formation of untransferred region 64a on solar cell 11 is not easily detected, and solar cell 11 on which untransferred region 64a is formed may be allowed to move on to a subsequent step.

In contrast, in the embodiment, adhesive tape 61 includes non-adhesive region 64, and thus in the inspecting, the following are inspected: whether adhesive layer 63 having at least a predetermined length is transferred onto solar cell 11; and whether an unnecessary foreign object touches solar cell 11.

Advantageous Effects Etc.

Encased adhesive tape 50 according to the embodiment includes: adhesive tape composite 60 that includes adhesive tapes 61 and connecting components 65, adhesive tapes 61 each including base film 62 and being arranged adjacent to one another in longitudinal direction L of base film 62, connecting components 65 being band-shaped and each being arranged between adhesive tapes 61, base film 62 being a film that is band-shaped and on which adhesive layer 63 is disposed; and housing 80 that is connected to one end of adhesive tape composite 60 in longitudinal direction L, and houses adhesive tape composite 60. Each of adhesive tapes 61 includes non-adhesive region 64 in which adhesive layer 63 is not disposed, in end portion 62a out of end portions 62a and 62b of base film 62 in longitudinal direction L, end portion 62a being on the same side as the one end of adhesive tape composite 60.

With this, for example, when adhesive layer 63 is transferred onto solar cell 11 using encased adhesive tape 50, non-adhesive region 64 touches solar cell 11, and thus it is possible to inhibit a foreign object other than adhesive tape 61 from touching solar cell 11.

Moreover, a length of non-adhesive region 64 in longitudinal direction L may be predetermined distance d from an edge of end portion 62a.

With this, non-adhesive region 64 can ensure predetermined distance d, and thus it is possible to inhibit contact of a foreign object in non-adhesive region 64 having predetermined distance d.

Moreover, encased adhesive tape 50 may further include base-side connecting tapes 71 each of which connects a corresponding one of adhesive tapes 61 and a corresponding one of connecting components 65 on a front surface of the corresponding one of adhesive tapes 61 on a side facing base film 62.

With this, it is possible to connect adhesive tape 61 and connecting component 65 such that adhesive tape 61 and connecting component 65 do not easily separate. For this reason, when adhesive layer 63 is transferred onto solar cell 11 using encased adhesive tape 50, it is possible to efficiently transfer adhesive layer 63.

Moreover, encased adhesive tape 50 may further include first cover films 73 each of which covers adhesive layer 63 and non-adhesive region 64 of a corresponding one of adhesive tapes 61.

With this, it is possible to inhibit dust or dirt from settling on adhesive layer 63 and non-adhesive region 64. For this reason, when adhesive layer 63 is transferred onto solar cell 11 using encased adhesive tape 50, it is possible to inhibit a foreign object from settling on solar cell 11.

Moreover, each of connecting components 65 may include base material 66 that is band-shaped, and sticky layer 67 that is disposed on the base material, and encased adhesive tape 50 may further include second cover films 74 each of which covers a corresponding one of sticky layers 67.

With this, it is possible to inhibit dust or dirt from settling on connecting component 65. For this reason, when adhesive layer 63 is transferred onto solar cell 11 using encased adhesive tape 50, it is possible to inhibit a foreign object from settling on solar cell 11.

Moreover, encased adhesive tape 50 may further include cover-side connecting tapes 72 each of which connects a corresponding one of first cover films 73 and a corresponding one of second cover films 74 on a front surface on a side facing first cover film 73.

With this, first cover film 73 and second cover film 74 can be continuously taken off from an edge of first cover film 73, and thus it is possible to increase efficiency of taking off.

A method for manufacturing solar cell module 1 according to the embodiment includes: preparing two solar cells 11 that are adjacent to one another in a direction parallel to a light-receiving surface; forming finger electrodes 111 on each of two solar cells 11, finger electrodes 111 collecting electric charges generated from light received by solar cell 11; forming bus bar electrode 112 that extends in a direction crossing finger electrodes 111, bus bar electrode 112 electrically connecting finger electrodes 111; placing, along bus bar electrode 112, adhesive tape composite 60 of encased adhesive tape 50, and transferring adhesive layer 63 of adhesive tape composite 60 onto bus bar electrode 112; and disposing wiring member 20 on adhesive layer 63 transferred onto bus bar electrode 112, wiring member 20 electrically connecting two solar cells 11.

With this, when adhesive layer 63 is transferred onto solar cell 11 using encased adhesive tape 50, it is possible to inhibit a foreign object other than adhesive tape 61 from touching solar cell 11, and thus it is possible to prevent a deterioration in quality of solar cell 11.

Moreover, the method for manufacturing solar cell module 1 may further include inspecting adhesive layer 63 transferred, between (i) the placing and transferring and (ii) the disposing.

With this, it is possible to select and remove solar cell 11 in which a transfer failure has occurred.

Moreover, the inspecting may include inspecting whether adhesive layer 63 having at least a predetermined length is transferred onto each of two solar cells 11 or whether an unnecessary foreign object touches each of two solar cells 11.

With this, it is possible to select and remove solar cell 11 onto which adhesive layer 63 having at least the predetermined length is not transferred or solar cell 11 that is touched by the foreign object.

Variation of Embodiment

Next, the following describes encased adhesive tape 50 according to a variation of the embodiment.

Unlike the aforementioned embodiment, in the variation, adhesive tape composite 60A included in encased adhesive tape 50 does not include sticky layer 67 of connecting component 65, second cover film 74, and cover-side connecting tape 72.

Figure 10:
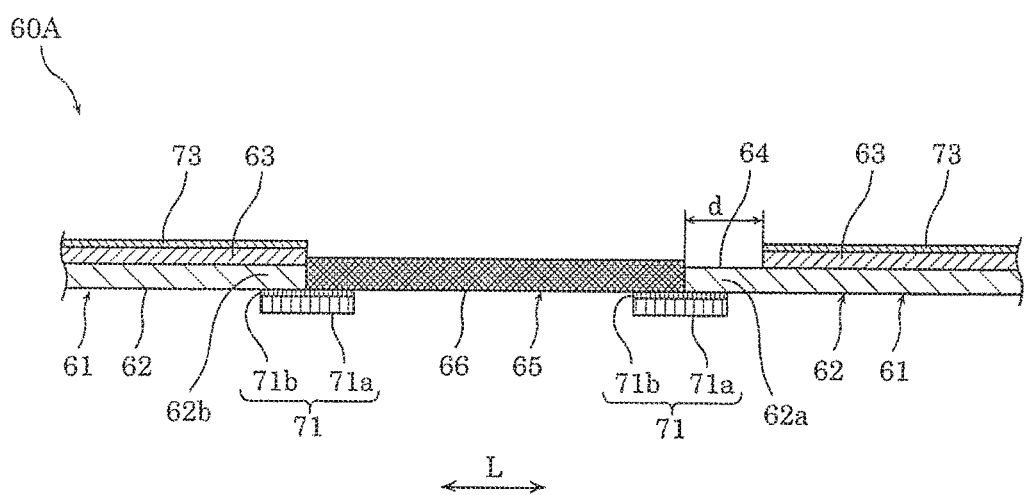
FIG. 10 is a cross-sectional view of an adhesive tape composite included in an encased adhesive tape in a variation of the embodiment.

FIG. 10 is a cross-sectional view of adhesive tape composite 60A in the variation.

Encased adhesive tape 50 according to the variation includes band-shaped adhesive tape composite 60A, and housing 80 that houses adhesive tape composite 60A.

Adhesive tape composite 60A includes adhesive tapes 61 adjacent to each other, and connecting components 65 each disposed between adjacent adhesive tapes 61. In addition, adhesive tape composite 60A includes first cover films 73 corresponding to adhesive tapes 61, and base-side connecting tapes 71.

Adhesive tapes 61 each include band-shaped base film 62 and adhesive layer 63 disposed on base film 62. Adhesive tapes 61 in the variation each also include non-adhesive region 64 in which adhesive layer 63 is not disposed. Non-adhesive region 64 is disposed at, out of end portions 62a and 62b of base film 62 in longitudinal direction L, end portion 62a located on the same side as one end of adhesive tape composite 60A.

First cover films 73 are disposed not on non-adhesive regions 64 but on adhesive layers 63. Connecting components 65 each include only base material 66, and sticky layer 67 is not disposed on base material 66. Cover film 74 is not disposed above each connecting component 65.

Accordingly, when adhesive tape composite 60A is pulled out from housing 80, non-adhesive regions 64 and connecting components 65 are exposed. It should be noted that when adhesive tape composite 60A is wound in housing 80, adhesive layers 63, non-adhesive regions 64, and connecting components 65 are not easily exposed to the air.

When adhesive layer 63 is transferred onto solar cell 11, adhesive tape composite 60A is pulled out from housing 80, first cover film 73 is taken off using a suction roller etc., and adhesive layer 63 is exposed. Exposed adhesive layer 63 is pressed to solar cell 11 and transferred onto bus bar electrode 112.

Encased adhesive tape 50 in the variation of the embodiment further includes first cover films 73 each of which covers adhesive layer 63 of adhesive tape 61 and does not cover non-adhesive region 64.

This makes it possible to reduce the number of components included in encased adhesive tape 50. In addition, adhesive tape composite 60A can be reduced in thickness because cover-side connecting tape 72 is not included.

Other Embodiments

Although encased adhesive tape 50 and solar cell module 1 according to the present disclosure have been described on the basis of the embodiment and variation, the present disclosure is not limited to the aforementioned embodiment and variation.

For example, although the reel has been described as an example of housing 80 that houses adhesive tape composite 60 in the aforementioned embodiment and variation, housing 80 is not limited to the reel. For example, adhesive tape composite 60 may be housed in a box-shaped housing.

Moreover, although adhesive tape composite 60 is wound and housed when housed in housing 80 such that adhesive layers 63 face inward and base films 62 face outward in the aforementioned embodiment and variation, the present disclosure is not limited to this. Adhesive tape composite 60 may be wound and housed such that base films 62 face inward and adhesive layers 63 face outward.

Moreover, although encased adhesive tape 50 of the aforementioned embodiment and variation is housed in a state in which first cover films 73 and second cover films 74 are disposed on adhesive layers 63, encased adhesive tape 50 may be housed in a state in which adhesive layers 63 are wound in contact with back surfaces of base films 62. In this case, a release treatment may be performed on the back surfaces of base films 62.

Moreover, although the conductive adhesive is used as the material of adhesive layers 63 in the aforementioned embodiment and variation, a nonconductive adhesive can be used as such. In this case, by appropriately designing an application thickness of a resin adhesive, the resin adhesive can be softened when transferred, and a front surface of bus bar electrode 112 and wiring member 20 can be electrically connected in direct contact with each other.

Moreover, although adhesive layers 63 each cover bus bar electrode 112 in whole in the aforementioned embodiment and variation, the present disclosure is not limited to this. Adhesive layers 63 may simultaneously cover bus bar electrodes 112 (three bus bar electrodes 112 in the embodiment).

Moreover, although adhesive layer 63 is formed to have the same length as the length of one side of solar cell 11 in the aforementioned embodiment and variation, the present disclosure is not limited to this. Adhesive layer 63 may be formed on bus bar electrode 112 with an infinitesimal distance from an edge of solar cell 11 so that adhesive layer 63 has a length shorter than the length of the one side.

Moreover, it is sufficient if solar cell 11 has a function of providing the photovoltaic power effect in the aforementioned embodiment and variation, and solar cell 11 is not limited to the structure of the solar cell described above.

Moreover, although the aforementioned embodiment and variation have shown aspects in which an electrode configuration having the features as described above is disposed on the front surface of the solar cell, the electrode configuration having the features may be disposed on only the back surface of the solar cell or on the front and back surfaces of the solar cell.

Moreover, the bus bar electrodes and the finger electrodes need not be arranged in a straight line, and may be arranged in a curved line.

Moreover, although the solar cell module according to the aforementioned embodiment has a configuration in which solar cells are arranged in a matrix on a plane, the solar cells need not be arranged in a matrix. For example, the solar cells may be arranged in a circle or a one-dimensionally straight or curved line.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

What is claimed is:

1. An encased adhesive tape, comprising:
    an adhesive tape composite that includes a plurality of adhesive tapes and a plurality of connecting components, the plurality of adhesive tapes each including a base film and being arranged adjacent to one another in a longitudinal direction of the base film, the plurality of connecting components being band-shaped and each being arranged between the plurality of adhesive tapes, the base film being a film that is band-shaped and on which an adhesive layer is disposed; and
    a housing that is connected to one end of the adhesive tape composite in the longitudinal direction, and houses the adhesive tape composite,
    wherein each of the plurality of adhesive tapes includes a non-adhesive region in which the adhesive layer is not disposed, in an end portion out of end portions of the base film in the longitudinal direction, the end portion being on the same side as the one end of the adhesive tape composite.

2. The encased adhesive tape according to claim 1, wherein a length of the non-adhesive region in the longitudinal direction is a predetermined distance from an edge of the end portion.

3. The encased adhesive tape according to claim 1, further comprising:
    a plurality of base-side connecting tapes each of which connects a corresponding one of the plurality of adhesive tapes and a corresponding one of the plurality of connecting components on a front surface of the corresponding one of the plurality of adhesive tapes on a side facing the base film.

4. The encased adhesive tape according to claim 1, further comprising:
    a plurality of first cover films each of which covers the adhesive layer and the non-adhesive region of a corresponding one of the plurality of adhesive tapes.

5. The encased adhesive tape according to claim 4, wherein each of the plurality of connecting components includes a base material that is band-shaped, and a sticky layer that is disposed on the base material,
    the encased adhesive tape further comprising: a plurality of second cover films each of which covers a corresponding one of the sticky layers.

6. The encased adhesive tape according to claim 5, further comprising:
    a plurality of cover-side connecting tapes each of which connects a corresponding one of the plurality of first cover films and a corresponding one of the plurality of second cover films on a front surface on a side facing the first cover film.

7. The encased adhesive tape according to claim 1, further comprising:
    a plurality of first cover films each of which covers the adhesive layer of a corresponding one of the plurality of adhesive tapes, and does not cover the non-adhesive region of a corresponding one of the plurality of adhesive tapes.

8. A method for manufacturing a solar cell module, the method comprising:
    preparing two solar cells that are adjacent to one another in a direction parallel to a light-receiving surface;

forming a plurality of finger electrodes on each of the two solar cells, the plurality of finger electrodes collecting electric charges generated from light received by a solar cell;

forming a bus bar electrode that extends in a direction crossing the plurality of finger electrodes, the bus bar electrode electrically connecting the plurality of finger electrodes;

placing, along the bus bar electrode, the adhesive tape composite of the encased adhesive tape according to claim 1, and transferring the adhesive layer of the adhesive tape composite onto the bus bar electrode; and disposing a wiring member on the adhesive layer transferred onto the bus bar electrode, the wiring member electrically connecting the two solar cells.

9. The method according to claim 8, further comprising:

inspecting the adhesive layer transferred, between (i) the placing and transferring and (ii) the disposing.

10. The method according to claim 9, wherein the inspecting includes inspecting whether the adhesive layer having at least a predetermined length is transferred onto each of the two solar cells or whether an unnecessary foreign object touches each of the two solar cells.

\* \* \* \* \*